United States Patent [19]

Haskell

[11] Patent Number: 4,964,143
[45] Date of Patent: Oct. 16, 1990

[54] EPROM ELEMENT EMPLOYING SELF-ALIGNING PROCESS

[75] Inventor: Jacob D. Haskell, Palo Alto, Calif.

[73] Assignee: Advanced Micro Devices, Inc., Sunnyvale, Calif.

[21] Appl. No.: 276,278

[22] Filed: Nov. 23, 1988

Related U.S. Application Data

[63] Continuation-in-part of Ser. No. 162,822, Mar. 2, 1988, abandoned.

[51] Int. Cl.$^5$ .............................................. H01L 29/78
[52] U.S. Cl. ..................................... 357/23.5; 357/54; 365/185
[58] Field of Search ....................... 357/23.5, 54, 59 G, 357/23.9; 437/43; 365/185

[56] References Cited

U.S. PATENT DOCUMENTS

| | | | |
|---|---|---|---|
| 4,231,051 | 10/1980 | Custode et al. | 357/23.9 |
| 4,288,256 | 9/1981 | Ning et al. | 357/23.5 |
| 4,661,833 | 4/1987 | Mizutani | 357/23.5 |
| 4,768,080 | 8/1988 | Sato | 357/23.5 |

Primary Examiner—Andrew J. James
Assistant Examiner—Mark Prenty
Attorney, Agent, or Firm—David W. Collins

[57] ABSTRACT

A novel process is provided for fabricating contacts (46s, 40g, 46d) in a novel, completely self-aligned, planarized configuration for EPROM elements (66). The process of the invention permits higher packing densities, and allows feature distances to approach 0.5 μm and lower. The EPROM element comprises source (18) and drain (20) regions separated by a gate region (22) and is characterized by the gate region comprising two separate gates, a floating gate (40g) and a control gate (58), capacitively coupled together. The floating gate is formed on a gate oxide (38) over the substrate (16) and the gates are separated from each other and from the source and drain contacts by a dielectric (56). The EPROM element has two threshold voltages, one related to the operation of a "normal" MOS transistor and the other related to a "programmed" threshold, following programming of the transistor. Sensing the threshold voltage of the device permits a determination to be made whether the device is programmed. UV radiation erases the programming and restores and threshold voltage of the device to its pre-programmed level.

9 Claims, 6 Drawing Sheets

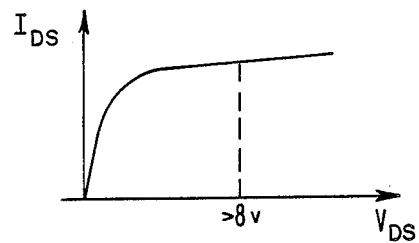
Fig. 14.
Fig. 15a.
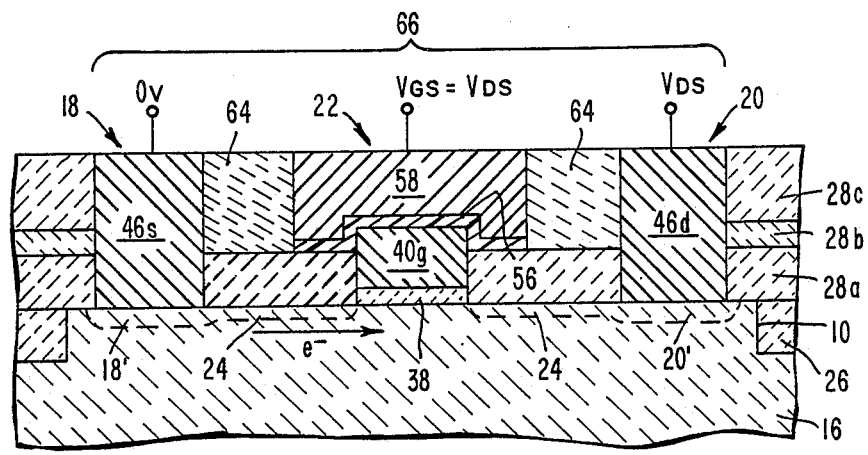
Fig. 15b.
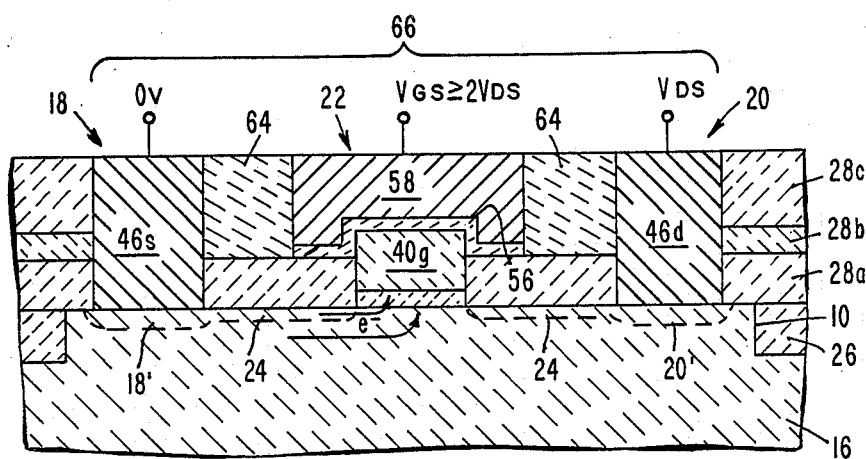

EPROM ELEMENT EMPLOYING SELF-ALIGNING PROCESS

CROSS-REFERENCE TO RELATED APPLICATION

This application is a continuation-in-part application of Ser. No. 07/162,822, filed Mar. 2, 1988 and now abandoned.

BACKGROUND OF THE INVENTION

1. Field of the Invention

The present invention relates to EPROM programming elements, and, more particularly, to a new device structure and process for preparing such elements, resulting in a completely self-aligned structure.

2. Background of the Invention

The LOCOS (local oxidation of silicon) process for fabricating MOS (metal-oxide semiconductor) devices, especially CMOS (complementary MOS) is well-known and widely practiced throughout the semiconductor industry. It is a suitable process for design geometries greater than about 1 $\mu$m feature size.

However, as feature sizes are reduced to sub-micrometer dimensions to achieve higher packing densities of devices, several problems emerge.

First, the depth of focus of the lithography stepper becomes smaller. Thus, the different heights of different features generate a depth of field problem.

Second, the spacing of contacts to the polysilicon gate and to the field oxide becomes critical at smaller dimensions. It will be appreciated that due to the use of separate alignment steps, the margin of error in aligning the contact can, if not adequate, result in either (a) etching through the field oxide, with consequent shorting of the silicon substrate to the diffusion source or drain region by the contact, or (b) contacting the polysilicon gate, with consequent shorting of the gate to the source or drain contact.

Such misalignments are accommodated by allowing a substantial space between source, drain and gate and between source, drain and field edge. As a result, high packing density is sacrificed.

Another requirement of the present processing scheme is that the gate contact is made to an interconnect which extends at right angle to the source-gate-drain line. Such a contact requires considerably more area than a contact directly down to the gate. However, the use of separate alignments dictate the present processing scheme, in order to avoid potential misalignment problems.

Finally, a problem well-known in the art with the LOCOS process is the so-called "bird's beak" problem, which occurs where the field oxide tapers to the substrate in the source and drain regions. Such a taper results in an electrical width smaller than the mask dimensions.

It is evident that the profusion of different heights during processing and the several alignment steps prevent efficient use of advanced lithography processes and other processes to generate high packing densities of devices on a substrate, since the depth of field reduces with the smaller dimensions that are needed for scaling.

The fabrication of erasable programmable read only memory (EPROM) elements is based on the LOCOS process, with its attendant problems. It is desired to simplify the manufacturing and provide a simpler construction of EPROM elements.

SUMMARY OF THE INVENTION

Accordingly, it is an object of the invention to provide EPROM elements which are formed by a process which avoids most, if not all, the problems associated with prior art processes.

It is another object of the invention to provide an EPROM structure which is efficient in its use of layout area.

In accordance with the invention, a new process is provided, which is intended to supplant the LOCOS process, for fabricating EPROM elements. The process of the invention employs planarization processes and total self-alignment to avoid most, if not all, the disadvantages associated with the prior art process. As a result, high packing densities may be achieved.

Planarization avoids the depth of field problem. Self-alignment easily permits various components of the devices to be interconnected in any manner selected by the engineer, without the misalignment area penalties discussed earlier. The process of the invention permits the use of plugs of polysilicon, the tops of which can be contacted to reduce gate contact area requirements. Feature distances of 0.5 $\mu$m and less may be achieved by the process of the invention.

A unique combination of masks in conjunction with a multi-layer structure formed on the surface of a semiconductor wafer, the multi-layer structure including a buried etch-stop layer therein, defines the source, gate and drain elements and their geometry relative to each other and to interconnects. Polysilicon plug contacts through slots in the multi-structure layer permit vertical contact to be made to the various elements.

The EPROM element of the invention comprises a MOS transistor comprising source and drain regions contacted by source and drain contacts, respectively, separated by a gate region formed on a substrate and is characterized by the gate region comprising two separate gates, a floating gate and a control gate, capacitively coupled together.

The floating gate is formed on a gate oxide over the substrate and the gates are separated from each other and from the source and drain contacts by a dielectric.

The process also enables efficient coupling of the floating gate to the control gate by employing "peripheral overlap" of the electrodes. In addition, the structure enables the control gate to be efficiently decoupled from the source and drain areas by employing a thick intervening dielectric between the areas.

The EPROM element of the invention has two threshold voltages, one related to the operation of a "normal" MOS transistor and the other related to a "programmed" threshold, following programming of the transistor. During normal operation, the voltage on the floating gate is about the same as that of the drain, with the source at ground potential. During programming, the control gate is made more positive with respect to the drain. This control gate couples to the floating gate, raising its potential. This in turn injects electrons into the gate oxide under the floating gate, thereby lowering the threshold of the device. Sensing the threshold voltage of the device permits a determination to be made whether the device is programmed. UV radiation erases the programming and restores the threshold voltage of the device to its preprogrammed level.

The process of the invention requires fewer steps than the conventional LOCOS process and provides an EPROM element having both a higher coupling between electrodes and a smaller size.

Other objects, features and advantages of the present invention will become apparent upon consideration of the following detailed description and the accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

FIG. 14, on coordinates of current and voltage, is a plot of the I-V characteristics of the EPROM element of the invention, as formed by the process steps delineated in FIGS. 1–13.

FIGS. 15a and 15b are views similar to FIG. 13a, showing the flow of electrons for an N-channel device during normal operation (FIG. 15a) and during programming (FIG. 15b).

DETAILED DESCRIPTION OF THE INVENTION

Figure 1A:
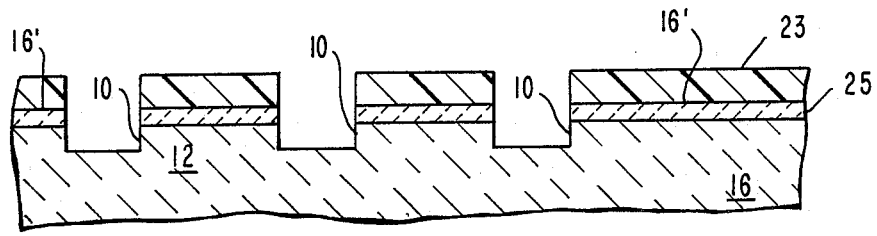
FIGS. 1–13 depict the sequence of events in the process of the invention, with the "a" designation depicting cross-sectional views and the "b" designation depicting top plan views.

Reference is now made in detail to a specific embodiment of the present invention, which illustrates the best mode presently contemplated by the inventor for practicing the invention. Alternative embodiments are also briefly described as applicable.

The process of the invention, in its preferred form, is totally non-LOCOS. However, it will be appreciated by those skilled in the art that portions of the process may be incorporated in the present LOCOS process to realize the benefits disclosed herein. Further, while the process of the invention is directed specifically to employing silicon as the semiconductor, it will be clear to those skilled in the art that the teachings of the invention may be extended to other semiconductors, with suitable modifications in etch-stop layers and the like.

The process of the invention begins with the formation of an isolation trench 10 surrounding the area in which a device, (here, an MOS transistor 14, seen in FIG. 11a), is to be fabricated in a P-well region 12 in a semiconductor substrate 16. There are a plurality of such isolation trenches 10, one associated with each device 14.

Alternatively, a conventional LOCOS oxide could be used, which would permit omission of oxide layer 28a, discussed below.

Figure 10A:
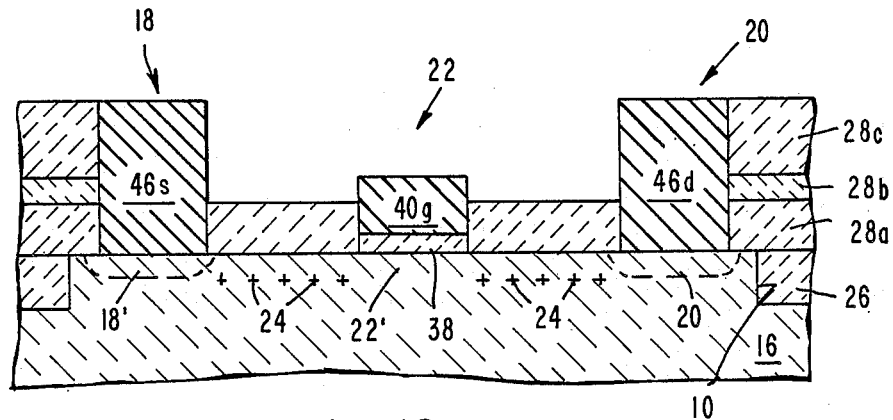

As is well-known, such transistors 14 comprise source 18 and drain 20 elements, with a gate area 22 therebetween to regulate the extent of a connector 24 therebetween (seen in FIG. 10a). The formation of P-wells is known, and hence does not form a part of this invention.

Figure 2A:
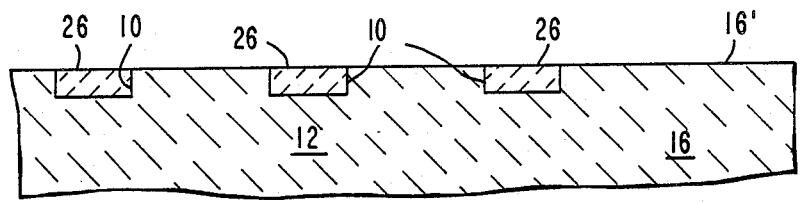

As shown in FIG. 1a, a plurality of trenches 10 surrounding well regions 12 in a semiconductor substrate 16 are etched through a resist mask 23 formed on top of a nitride mask 25 formed on the surface 16' of the substrate. The resist 23 and the nitride 25 are then stripped and the trenches 10 are filled with an oxide 26, as shown in FIG. 2a.

The etching of the trench is done employing well-known processes, such as an RIE (reactive ion etch) process followed by suitable wet silicon damage removal etches. The oxide 26 used to fill the trenches 10 may be a low temperature oxide or a preferred 750° C. TEOS (tetra-ethyl ortho silicate). The oxide is etched back to be planar with the surface 16' of the silicon substrate 16. The planarizing is done by a combination of chemical and reactive ion etching processes commonly used in the art for oxide planarization.

The isolation trench 10 is created by etching a four-walled trench to outline an active region of the appropriate length (X) and width (Y). In the process of the invention, the trench 10 has a rectangular configuration, when viewed in top plan view (FIG. 3b), defining an active area (X x Y) of about 5 $\mu$m by 2 $\mu$m (for 1 $\mu$m design rules).

The isolation trench is typically about 0.5 to 1 $\mu$m wide and about 0.4 to 0.6 $\mu$m deep. The size is governed by lithography alignment constraints and filling of the trenches by subsequently deposited oxide.

Figure 3A:
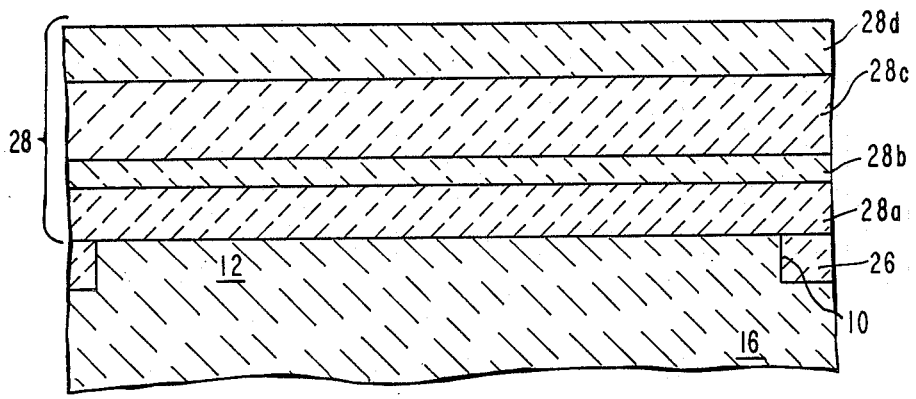

While one complete trench is shown in the FIG. 3a, it will be appreciated that a plurality of such trenches is employed on a single semiconductor substrate 16, as shown in FIG. 2a, each delineating an active area of a device. Of course, as the technology of feature definition continues to improve with new resists and resist development processes, these dimensions will also decrease.

Next, a specific sequence of layers 28 is formed on the surface of the substrate 16, as shown in FIG. 3a. The particular sequence of layers 28 is the crux of the invention. This multi-layer structure includes a buried stop-etch layer, essential in the practice of the invention.

First, a field oxide 28a, having a thickness of about 2,500 Å ± 5%, is formed on the surface of the substrate 16. The thickness of the field oxide 28a can be targeted consistent with the field threshold voltage required and subsequent implant energy available for forming N⁻ connectors, described below.

The formation of the field oxide 28a in itself is not novel, and is formed by a conventional deposition process to the required thicknesses. The thickness selected depends upon the implant energy needed to implant therethrough versus the polysilicon left to block the implant, as discussed below in connection with FIG. 10a.

Ideally, the field oxide 28a should be as thin as possible consistent with the required field inversion voltages. Also importantly, the thickness of this layer 28a should be substantially uniform across the surface of the wafer, in order to best realize the benefits of the invention. For silicon-based devices, the field oxide comprises silicon dioxide.

Figure 9B:
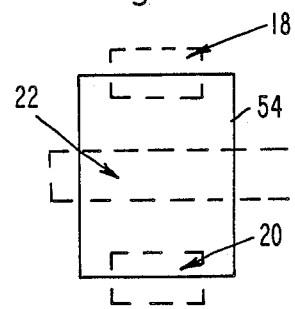
Figure 9A:
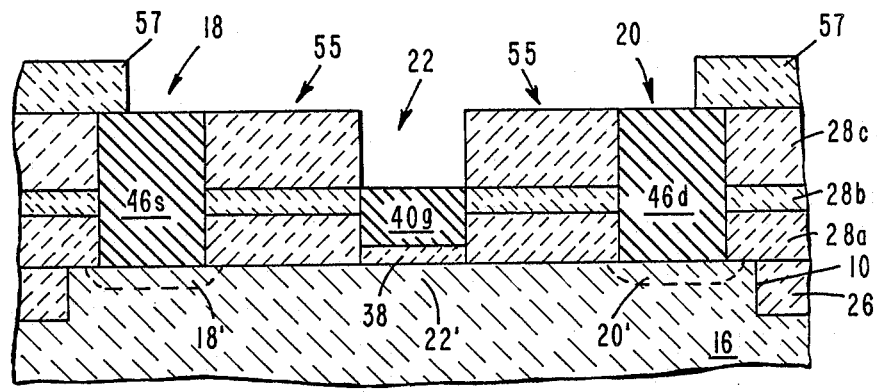
Figure 12A:
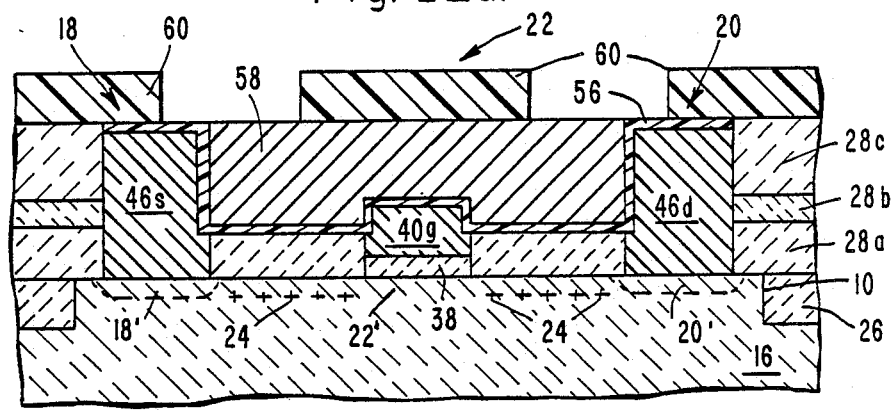

The field oxide layer 28a doubles as a decoupling layer between the control gate electrode 58 (see FIG. 12a and the discussion associated therewith) and the extensions to the source and drain junctions (18' and 20') formed by the connector implants (delineated 24 in FIG. 12a). For the most efficient programming to occur (programming is described in greater detail near the end of this section), the floating gate 40g (shown in FIG. 9a and subsequent Figures) must be closely capacitively coupled to the control gate 58 and poorly coupled to the source and drain extensions 24. The field oxide layer 28a therefore serves a dual purpose of a conventional field oxide in the non-EPROM circuitry and as a decoupling dielectric between the control gate 56 and the source/drain areas. A typical thickness that satisfies these constraints is about 2,500 Å±5%, as described above.

Next, a thin layer 28b of an etch-stop material is formed on the field oxide 28a. The etch-stop material 28b comprises a material having a significantly different etch rate from silicon dioxide and is important in the practice of the invention, as will be seen below. For silicon-based devices, a suitable etch-stop material comprises silicon nitride, having a thickness of about 800 Å±5%. The nitride can be deposited by LPCVD (low pressure chemical vapor deposition) or PECVD (plasma-enhanced CVD). The minimum and maximum thickness depend on the etch uniformity of the process and apparatus.

Over the nitride layer 28b is formed another layer 28c of oxide, ranging in thickness from about 5,500 to 6,500 Å. This oxide layer is conveniently formed in the same manner as the field oxide. This oxide layer 28c governs the depth of polysilicon plugs to be formed as discussed below and governs what remains of the polysilicon layer (interconnect polysilicon) following etch-back at the anti-contact mask, also discussed below, in connection with FIG. 8b. Thus, the thickness of the oxide layer 28c must be greater than the sum of about 4,000 Å of polysilicon removed and the residual interconnect thickness needed (about 2,000 Å) at that stage.

Finally, a layer 28d of polysilicon is formed on the oxide layer 28c to a thickness ranging from about 2,000 to 2,500 Å. This layer 28d has a dual purpose: it serves both as an etch mask and as a lithography "enhancement" layer, as explained in connection with FIG. 5b. While materials other than polysilicon may be used that have a good etch ratio to silicon dioxide, such as silicon nitride, polysilicon has several advantages. First, it has uniform reflectivity so that lithography is easier to control. Second, it has a better than 20:1 etch ratio to silicon dioxide so that it doubles as an etch mask even if overlying resist gets eroded away during the subsequent etching, thereby preventing dimension control losses.

The foregoing layers 28a-d may be sequentially deposited in one pump-down to reduce defect density.

A layer of resist 30 is next formed on the top polysilicon layer 28d and is exposed to a "slot" mask (dashed lines 32 in FIG. 4b), which simultaneously provides for mutual self-alignment between source 18, gate 22 and drain 20 regions. The slot mask 32 may also include provision for contact to other devices via extension 33 and for contact to the gate 22 via extension 35 and any other combinations thereof. It is a total level of interconnect, compared to conventional polysilicon, which is a half level. (The conventional half-level requires another level of interconnect to complete the connections.) In this manner, packing density of devices may be increased by nearly 50% over that of the prior art LOCOS process without critical alignment requirements. Further increases in density may be achieved as the technology of finer resist definition develops.

The slot mask defines the polysilicon interconnect areas in the field and the source/gate/drain areas of all the devices. The slot masks can be at minimum feature and minimum feature spaces that may be defined lithographically. As can be seen, the source/gate/drain areas are self-aligned with each other so far.

The resist 30 can be exposed by electromagnetic radiation (visible, UV, X-ray, as appropriate), as is conventional, and the undesired portions of the underlying four layers 28 are removed, such as by etching, to expose portions of the semiconductor substrate 16 corresponding to the source 18, gate 22 and drain 20 regions.

The four layers 28 are etched as follows: First, the exposed portions of the polysilicon layer 28d are etched using an RIE etcher, followed by etching the exposed portions of the oxide layer 28c, again, using an RIE etcher. This latter etch stops at the nitride layer 28b, since the etch rate of the oxide can be adjusted with etch parameters to be about five times that of the nitride. This method of etching allows controlled manufacturability of the etch, since the nitride layer 28b acts as a built-in "buried" etch stop.

The two etchings (of layers 28d, 28c) may be performed in one pump-down. At this point, the nitride layer 28b may be etched to the field oxide also, if it is desired to remove nitride from underneath the polysilicon layer 28d eventually.

The RIE etch process employs a mixture of oxygen and fluorinated gas, such as $CHF_3$, $CF_4$, $NF_3$, and the like. Controlled etch ratios between oxide and nitride are achieved by varying the ratio of the gases and, in some instances, the power of the etcher. The RIE etch process is well-known and thus does not per se form a part of this invention.

The resist 30 is stripped and the wafer is remasked, using an "active" mask (denoted by solid lines 34 in FIG. 5b, the trench 10 being omitted for clarity) in conjunction with a new resist layer 36. The purpose of this mask is two-fold. First, in the source 18/gate 22/drain 20 areas, the etch is completed to silicon or to the exposed oxide in the slots. Some of this exposed oxide in the trenches 10 will be etched ($\approx 500$ Å), corresponding to the required over-etch needed to clear the field oxide areas in the source 18, gate 22, and drain 20 openings down to the silicon substrate 16.

In the field areas or interconnect areas over the field, the mask covers this with resist and prevents etching. In this manner, the oxide 28a in the field region is ultimately retained under the polysilicon extensions 33, 35 in the field region, which is outside the area enclosed by the isolation trench 10 (including the trench oxide 26). This forms the polysilicon interconnections.

The exposed portions of the nitride layer 28b are then etched, stopping on the field oxide layer 28a, again using RIE. The etch ratio is adjusted to greater than about 3:1 nitride to oxide. The exposed portions of the field oxide layer 28a are then etched, to expose portions of the underlying silicon 16. Again, as indicated above, the etching of the nitride layer 28b and oxide layer 28a can be done sequentially in one pump-down in the same etcher, merely changing chemistry to accommodate the nature of the respective layers.

With an oxide-to-nitride etch ratio of $\geq 3:1$ and a non-uniformity of etch of ±10% and of the oxide layer 28c of ±10% and with the thickness of the oxide layer ranging from about 6,000 to 7,000 Å, it is possible to over-etch layer 28c and still stop on or in the nitride layer 28b. This gives in itself a large manufacturing advantage. In the prior art methods of etch-back, a "timed etch" would not overcome non-uniformity problems. A laser end-point method samples one wafer in a batch machine and is subject to the same uncertainties. Thus, the use of the "buried etch stop" nitride layer 28b is seen to provide a unique solution to yet another etch sequence that enhances the process of the invention. A second etch then removes the nitride layer 28b, stopping on the field oxide 28a.

Figure 3B:
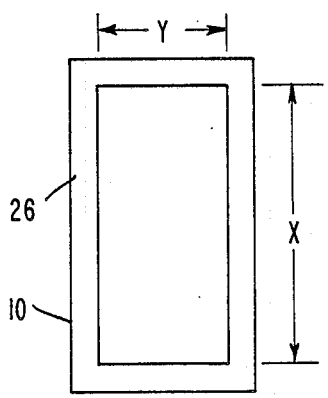
Figure 4A:
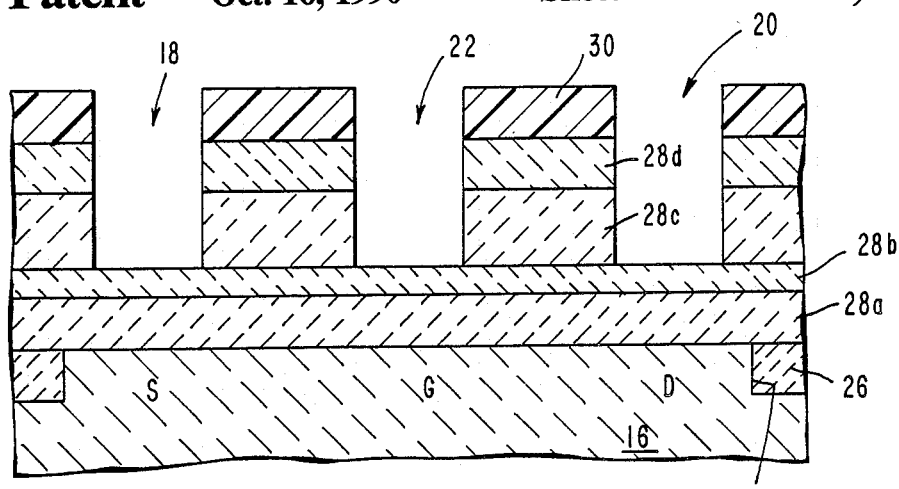
Figures 4B, 5B:
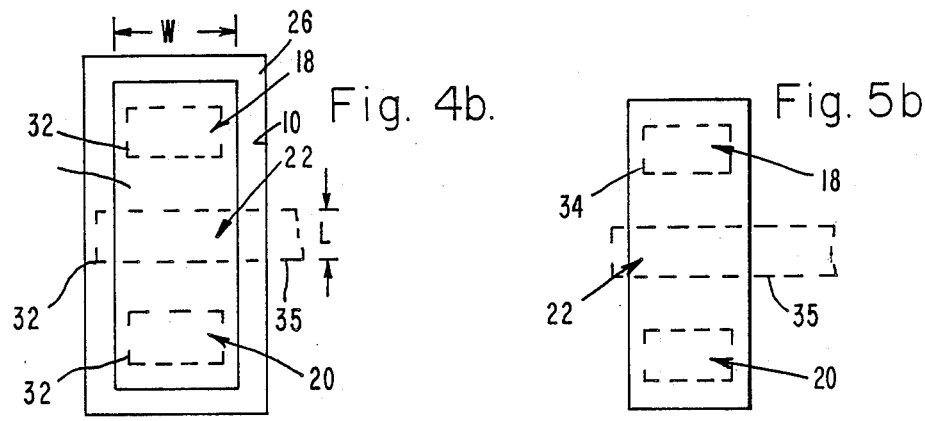
Figure 5A:
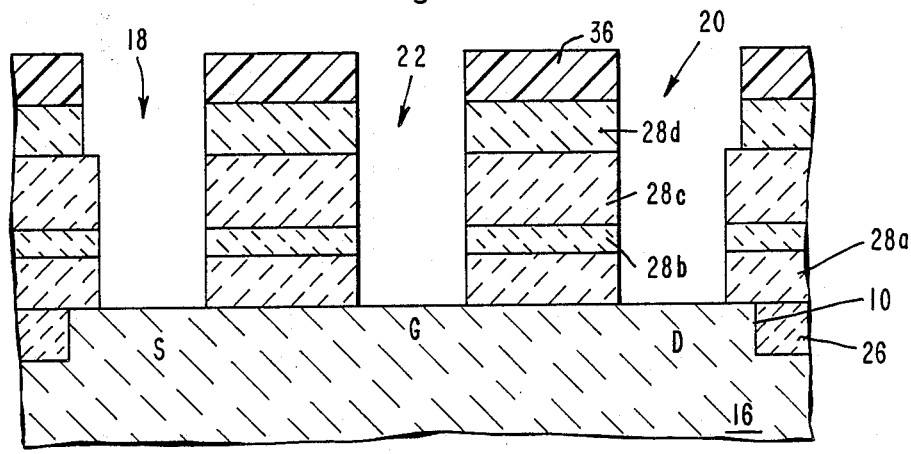

With the completion of the etching down to silicon, the width W of the device has been defined by the trench mask 10 in FIGS. 3b and 4b as Y=W. The length of the channel (geometric), denoted L, has already been defined in the first etch, using the slot mask 32. Thus, the source 18, gate 22 and drain 20 regions have been defined geometrically, together with the device length L of the channel under the gate and the width W under the gate.

Figure 6A:
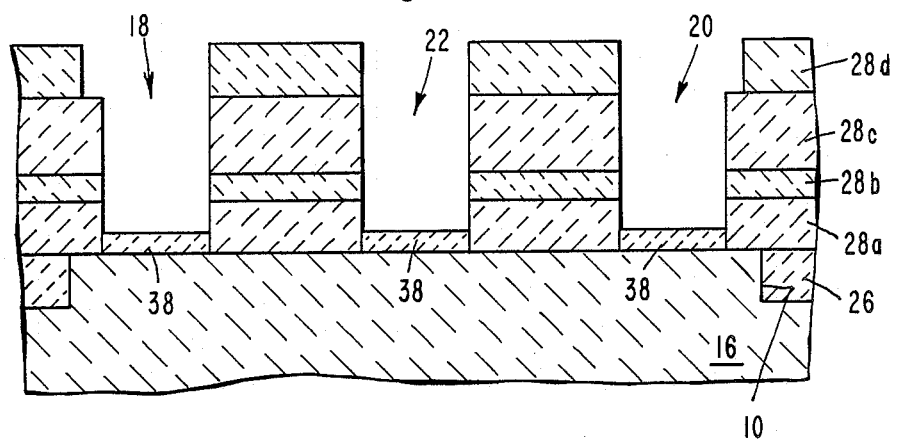

After etching through the field oxide layer 28a, the resist layer 36 is removed in a conventional manner and a thin oxide film 38 (the gate oxide) is grown in the exposed portions of the semiconductor substrate 16 (FIG. 6a). The gate oxide 38, as is conventional, is formed to a thickness of about $150\pm10$ Å, or less, depending on the scaling of the devices.

Figure 7A:
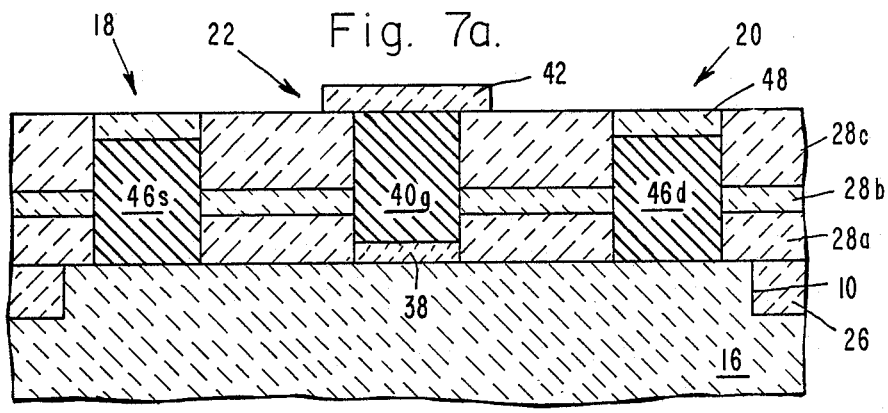
Figure 7B:
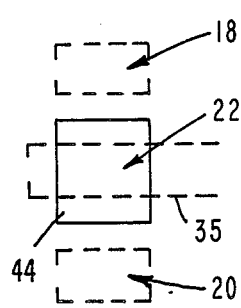

A source/drain etch-out mask (denoted by solid lines 44 in FIG. 7b) is used to cover and protect the n-MOS gate areas, as shown at 42 in FIG. 7a. Next, those portions of the gate oxide layer in the source 18, drain 20 areas are removed such as by a wet etch dip or by RIE etching or a combination thereof. The resist is then stripped off the wafer.

A polysilicon layer is blanket-deposited to a thickness of about 7,000 Å$\pm$5% (for 1 $\mu$m feature widths) and then etched or polished (chemical/mechanical) back to stop on the upper oxide layer 28c. The polysilicon fills all the source 18, gate 22 and drain 20 slots, as well as all the interconnect slots 32. (The polysilicon filling the gate 22 slot is denoted 40g in FIG. 7a, and in connection with EPROM structures, is referred to as the floating gate).

The polysilicon layer is polished back (chemical/mechanical), using the same apparatus as in silicon wafer polish, to planarize the polysilicon.

Next, a doping cycle is performed. In this doping cycle, the polysilicon gates 40g are not doped until the end of the process.

To this end, an oxide layer 48 is formed everywhere, for example, thermally grown at about 900° C., typically to a thickness of about 125 Å$\pm$10%. This doubles as an ion implantation screen and a nitride etch stop, and accordingly, the thickness is governed by these considerations. $B_{11}$ ions are implanted to give P+doping into the N+areas that are open. Where it is desired to form N+doping, a nitride layer 42 about 600 to 800 Å thick (sufficient to mask POCl$_3$) is deposited, masked using the N+mask, and etched away together with the 125 Å oxide layer 48 underneath to stop on polysilicon to expose N+regions, which are then counter-doped with POCl$_3$ (these regions were previously doped with boron).

The N+44 mask (shown in FIG. 7b) employs nitride as the mask for N-MOS devices. As seen in FIG. 7a, the mask 42 protects the gate area 22 against doping. This is different compared to conventional N+masks, wherein the source, gate and drain are all of the same doping; that is, the NMOS areas are completely opened and the gates are not protected.

It will be recalled that the N wells 12 are already in place prior to trench formation. Of course, the source and drain polysilicon plugs of each isolated region or device 14 are doped to a conductivity opposite that of the well 12 of that region, except where contacts to these are needed, they are then the same conductivity.

Figure 8A:
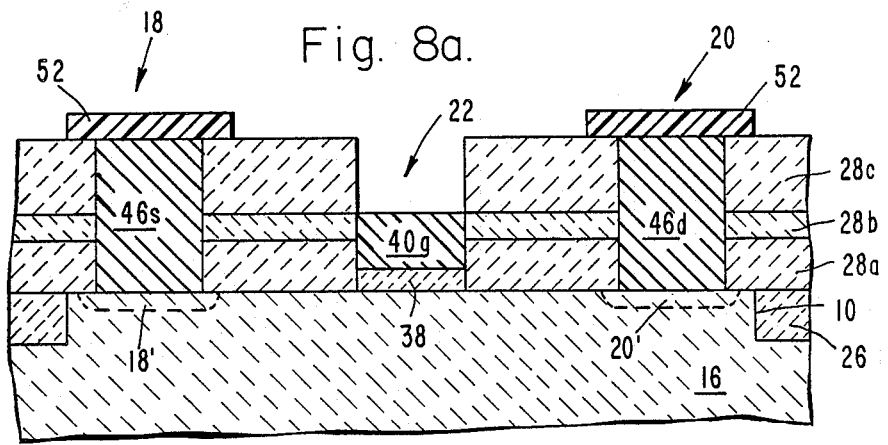
Figure 8B:
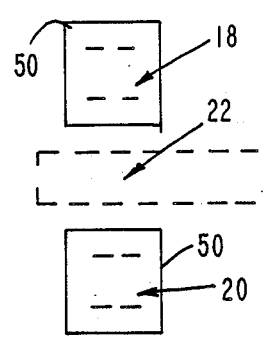

The assembly is heated to about 900° C. for about 60 min., to drive the dopants to form N+junctions/regions for both sources 18 and drains 20 in the semiconductor. For example, as seen in FIG. 8a, doped regions 18', 20' are formed by the drive. The temperature and time may be varied, depending on the plug depth and junction depth needed. Alternatively, a rapid thermal anneal may be used to drive the junctions.

The gate is still undoped, since doping the gate polysilicon 40g would result in the dopant species penetrating the thin gate oxide 38 to the underlying semiconductor 16, and causing potential reliability problems.

The masking nitride cap 42 is next removed over the gate areas 22.

At this stage, it is seen that the three layers (field oxide 28a, nitride 28b, and oxide 28c), are planarized, with planarized polysilicon plugs 46s, 40g, 46d to sources 18, gates 22, and drains 20, respectively, on the semiconductor substrate 16. All sources, gates, drains and interconnects are mutually self-aligned. After the definition and drive of the plugs, a novel contact scheme, as described in detail below, can be implemented.

The devices now must be connected to the gate edges, as will be described in detail below. The following discussion involves the formation of contacts directly over the gate electrode 40g without degrading the gate oxide 38. This configuration permits scaling of the feature sizes.

In conventional LOCOS technologies, the thickness of the polysilicon over the gate areas has to be scaled down to present reasonably planar or small step heights, as the aspect ratios get worse. A contact cannot be made directly on this gate over the gate oxide without degrading the gate breakdown.

Thus, another aspect of the novel approach of this invention is that it allows a planar surface to be present at the contact-making step and at the metal deposition step immediately following it, which affords a manufacturing advantage at small geometries. The inventive approach also makes refill technologies and methods less demanding than conventional methods.

An "anti-contact" resist mask (denoted by the crossed areas 50 in FIG. 8b) is formed as a layer 52 on the polysilicon layers 40g, 46s, 46d and patterned to cover the source 46s and drain 46d polysilicon and other desired regions of connectors. In the anti-contact mask 50, resist is left where the contacts are required, as distinct from a conventional contact mask where these contact areas are normally opened.

Next, the exposed portions of the polysilicon layer 46 are etched with a timed etch to remove a specific amount of polysilicon, using an etchant that has good selectivity to the underlying oxide is non-preferential with respect to N+ or undoped polysilicon. An example of such an etchant is chlorine-based plasma chemistry. In particular, about 4,000 Å$\pm$5% of polysilicon is removed. This amount will be the programming dielectric layer plus the control gate, the formation and purpose of which are discussed below.

The contacts can overlap the oxide because the RIE polysilicon/oxide ratio evidences >20:1 selectivity. The contacts that are being defined are features in the resist and not openings in the resist as in conventional contact schemes, making lithography easier.

The resulting structure is shown in FIG. 8a. It will be seen that the polysilicon gate 40g is recessed by the etching, since it is an area that is not to be contacted.

Other areas recessed by the etching (not shown) also will not be contacted.

Figure 11A:
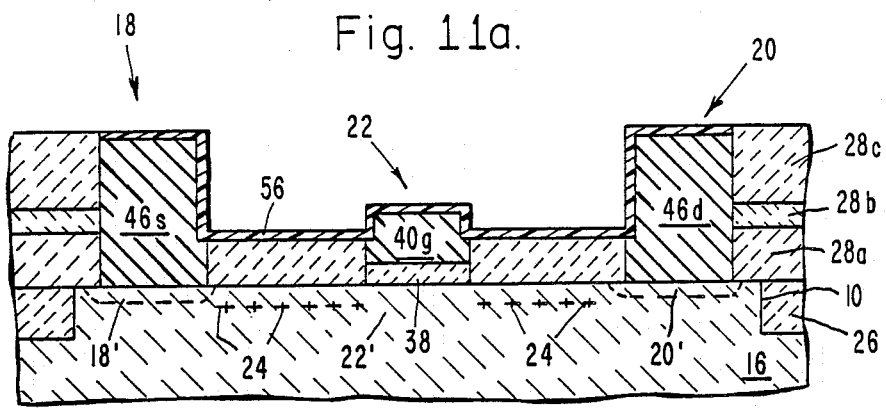

All the etched back areas at this stage have a similar width in one direction. The polysilicon in the gate is the width of the slot in which it resides (parallel to the plane of FIG. 8a). It is thus easy to fill these areas with spin-on glass to obtain a very flat topology as shown in FIG. 11a and as discussed in further detail below.

The patterned resist 52 is removed, leaving contact to source 46s and drain 46d "buttons".

A connector mask (denoted in FIG. 9b by solid lines 54) is employed to define portions 55 of the oxide layer 28c by use of a resist layer 57. These portions 55 are removed by etching, using the underlying nitride layer 28b as an etch stop. The exposed portions of the nitride layer 28b are then removed by etching, stopping on the field oxide layer 28a.

It should be noted that this etch is identical to that discussed above in forming the interconnects and has all the advantages referred to therein.

Implantations of appropriate ions (for N channels 24 connecting source 18' and drain 20' to the gate 22' edges) are then done through the exposed portions of the field oxide 28a to connect and form the transistors (N-type). It will be noted that the oxide to be implanted through is the field oxide 28a, which has been deposited to a well-controlled thickness, as described above.

The wafer is now implanted, using the N-mask, with phosphorus for the n-channels ($\approx 250$ keV at $5 \times 10^{14}$ cm$^{-2}$). The operation is done using the sequence of N-mask and etch, N-implant, and resist strip. The source 18'/drain 20' junctions are now connected to the gate region 22' (seen in FIG. 10a), completing the MOS FET device 14. The extensions 24 are denoted "+".

Due to scattering at right angles to the implant direction, there is advantageously an implant "tail" underneath the gate edges that results in a graded junction. This is beneficial for reducing hot electron effects for short channel devices, as is well-known.

During the connector implantation, the gate polysilicon plugs 40g are also lightly doped with the same implant. The doping is driven slightly, such as at about 800° to 1,000° C. for 15 to 30 seconds, by a rapid thermal anneal. This process activates the implants in the extensions 24 but does not cause excess diffusion of the implants, thereby avoiding penetration of the gate oxide 38. (The faster diffusion rates in polysilicon, however, allow substantially uniform doping of the gate polysilicon with this short cycle.) In this manner, N polysilicon plugs over the gates are formed.

A layer 56 of inter-polysilicon dielectric is next grown over the exposed areas of polysilicon (46s, 46d, 40g) and oxide 28a therebetween, to form the programming dielectric. The dielectric layer may comprise (a) an oxide, such as silicon dioxide, ranging in thickness from about 100 to 200 Å, (b) an oxy-nitride about 100 Å thick formed by rapid thermal annealing of an oxide in ammonia, or (c) an oxide about 80 Å thick over which is deposited a LPCVD layer ($\approx 800°$ C.) of a nitride about 100 Å thick, which oxide layer can be slightly oxidized (e.g., 50 Å SiO$_2$) to give an oxide/nitride/oxide structure to seal any pinholes in the nitride and give better dielectric integrity. The latter dielectric layers improve the break-down voltage of the inter poly layer 56 while improving the coupling between the poly layers 40g and 58 (discussed below) because of the higher dielectric constant. Following deposition of the inter-polysilicon dielectric layer 56, the structure is as shown in FIG. 11a. This dielectric layer 56 is used as an etch-stop in the step described below.

A layer 58 of polysilicon is deposited everywhere and is polished back to be planar with the top of the sources 46s and drains 46d. The dielectric layer 56 also doubles as an etch-stop over the source 46s and drain 46d areas during the polish back. Layer 58 is termed the second poly level, and will comprise the control gate. A resist layer 60 is deposited and patterned to provide openings 62 to expose portions of the poly layer 58, as shown in FIG. 12a.

The exposed portions of polysilicon 58 are etched back to stop on the dielectric layer 56, forming openings 62. All exposed portions of the dielectric layer 56 are then etched away, the resist layer 60 is stripped, and the openings 62 are filled with oxide 64 to form an EPROM element 66, shown in FIG. 13a.

The formation of the control gate 58 in this manner, together with the overlap of the floating gate 40g enables coupling between the two electrodes to take place both in the horizontal interface between the two and in the vertical sidewall areas of the interfaces. This additional coupling between the floating gate 40g and the control gate 58, referred to as "peripheral overlap", greatly increases the coupling efficiency of the cell.

Contacts may be made to the source 46s, drain 46d, and control gate 58 by means well-known in the art.

A number of modifications of the main process of the invention may be made.

In one modification, tungsten may be used in place of polysilicon, such as for the source/drain contacts. If tungsten is employed, then the process should be modified to implant the substrate first, then deposit tungsten. In this modification, any polysilicon used, such as in the gates, would also be deposited after implant of the substrate, and any subsequent implant would be to dope the polysilicon, not to form any junctions. The intersection of the polysilicon gates and tungsten interconnect will be ohmic, due to the formation of tungsten polysilicide at this intersection.

Figure 13A:
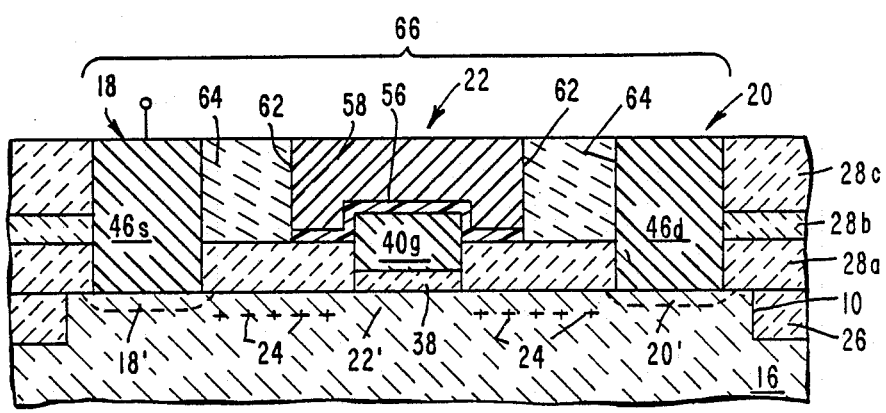

The operation of the device 66 is now described. The structure shown in FIG. 13a is an N-channel transistor with the floating gate 40g and control gate 58 capacitively coupled (as distinct from electrically coupled) through the dielectric 56.

The basic premise is that the device 66 has two threshold voltages: one related to the operation of a "normal" N-channel transistor and the other related to a "programmed" threshold, following programming of the transistor.

In the programming mode, the source 46s is at 0 V (ground), the drain 46d is at least 5 V and the voltage on the control gate 58 ($V_{GS}$) is equal to or less than that on the drain. Due to the capacitive coupling between the floating gate 40g and the control gate 58, the potential on the floating gate is substantially the same as that on the control gate. The current characteristics of the device, diagrammatically shown in FIG. 14, are considered "normal" for a transistor. The electrons flow from the source 46s to the drain 46d, as illustrated in FIG. 15a.

If the control gate voltage is made more positive (for example, at least twice the drain voltage, or about 11 to 13 V), the electrons are drawn into the gate oxide 38, as illustrated in FIG. 15b. When this occurs, the trapped electrons invert the p-type silicon at the surface so that an n-type surface layer is formed, having the characteristics diagrammatically shown in FIG. 14b. Consequently, the threshold voltage of the device is lowered. By sensing the threshold voltage of the element, a determination of whether the device is programmed may be made.

During programming, maximum efficiency is obtained if the coupling is a maximum between the floating gate 40g and the control gate 58 (obtained by the thin dielectric 56) and minimized elsewhere between the control gate 58 and the source/drain areas 18', 20' (obtained by the thick deposited field oxide 28a).

The EPROM element 66 may be erased by shining UV radiation thereon. Electrons trapped in the gate oxide 38 are made to recombine with holes generated by the UV radiation. This restores the threshold voltage of the device to its pre-programmed level.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar or other processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. An EPROM element (66) comprising a MOS transistor formed on a substrate (16) and comprising source (18) and drain (20) regions contacted by source (46s) and drain (46d) contacts, respectively, and a gate region (22) therebetween comprising a floating gate (40g) and a control gate (58), said control gate formed above said floating gate, said floating and control gates capacitively coupled together and separated from each other by a first dielectric (56) and from said source and drain contacts by a second dielectric (64), characterized by (a) alignment of said source and drain contacts to said floating gate, (b) said source and drain contacts and said control gate comprising conducting plugs, disposed in openings formed in insulating material (28) formed on said substrate, said openings defined by substantially perpendicular walls, said plugs terminating in upper connecting surfaces to form a coplanar surface in an area above said substrate and substantially parallel to said substrate for contacting by planar interconnects, and (c) said source and drain plugs and said floating gate having a substantially identical width parallel to said substrate.

2. The EPROM element of claim 1 wherein said MOS transistor comprises an N-channel device.

3. The EPROM element of claim 1 wherein said first dielectric separating said floating and control gates comprises a material selected from group consisting of (a) an oxide, ranging in thickness from about 100 to 200 Å; (b) an oxynitride about 100 Å thick; and (c) a first layer comprising an oxide about 80 Å thick and a second layer comprising a nitride about 100 Å thick.

4. The EPROM element of claim 3 wherein in group (c), said second layer of silicon nitride is slightly oxidized to provide an oxide/nitride/oxide structure.

5. The EPROM element of claim 1 wherein said source and drain contacts consist essentially of polysilicon.

6. The EPROM element of claim 1 wherein said source and drain contacts consist essentially of tungsten.

7. The EPROM element of claim 1 wherein a portion of said insulating material is of sufficient thickness to capacitively decouple said control gate from said substrate and wherein said second dielectric is of sufficient thickness to decouple said control gate from said source and drain contacts.

8. The EPROM element of claim 1 wherein said floating gate has a top surface and side surfaces and said control gate is capacitively coupled to said floating gate both at said top surface of said floating gate and around at least a portion of said surfaces of said floating gate.

9. The EPROM element of claim 8 wherein said first dielectric is substantially uniform in thickness.

* * * * *